(12) United States Patent
Maleki et al.

(10) Patent No.: US 7,801,189 B2
(45) Date of Patent: Sep. 21, 2010

(54) CROSS MODULATION-BASED OPTO-ELECTRONIC OSCILLATOR WITH TUNABLE ELECTRO-OPTIC OPTICAL WHISPERING GALLERY MODE RESONATOR

(75) Inventors: Lutfollah Maleki, Pasadena, CA (US); Andrey B. Matsko, Pasadena, CA (US); Anatoliy Savchenkov, Glendale, CA (US); Vladimir Ilchenko, Arcadia, CA (US)

(73) Assignee: OEWaves, Inc., Pasadena, CA (US)

( * ) Notice: Subject to any disclaimer, the term of this patent is extended or adjusted under 35 U.S.C. 154(b) by 162 days.

(21) Appl. No.: 12/270,839

(22) Filed: Nov. 13, 2008

(65) Prior Publication Data

US 2009/0135860 A1    May 28, 2009

Related U.S. Application Data

(60) Provisional application No. 61/002,919, filed on Nov. 13, 2007.

(51) Int. Cl.
*H01S 3/10* (2006.01)
*G02F 1/03* (2006.01)
*G02F 1/035* (2006.01)

(52) U.S. Cl. ............... 372/26; 372/18; 372/20; 372/29.011; 372/32; 359/245; 359/246; 359/247; 359/239; 385/2; 385/8

(58) Field of Classification Search ........... 372/18, 372/20, 2–28, 29.011, 326; 359/245–247, 359/239; 385/2, 8
See application file for complete search history.

(56) References Cited

U.S. PATENT DOCUMENTS

| | | | |
|---|---|---|---|
| 5,204,640 A | 4/1993 | Logan, Jr. | |
| 5,220,292 A | 6/1993 | Bianchini et al. | |
| 5,723,856 A | 3/1998 | Yao et al. | |
| 5,751,747 A | 5/1998 | Lutes et al. | |
| 5,777,778 A | 7/1998 | Yao | |
| 5,917,179 A | 6/1999 | Yao | |
| 5,929,430 A | 7/1999 | Yao et al. | |
| 5,985,166 A | 11/1999 | Unger et al. | |
| 6,080,586 A | 6/2000 | Baldeschwieler et al. | |
| 6,178,036 B1 | 1/2001 | Yao | |
| 6,203,660 B1 | 3/2001 | Unger et al. | |
| 6,389,197 B1 | 5/2002 | Iltchenko et al. | |

(Continued)

FOREIGN PATENT DOCUMENTS

WO    01/96936    12/2001

(Continued)

OTHER PUBLICATIONS

Braginsky, V.B., et al., "Quality-Factor and Nonlinear Properties of Optical Whispering-Gallery Modes," *Physics Letters A*, 137(7, 8):393-397, May 1989.

(Continued)

*Primary Examiner*—Minsun Harvey
*Assistant Examiner*—Michael Carter
(74) *Attorney, Agent, or Firm*—Perkins Coie LLP

(57) ABSTRACT

Examples and implementations of photonic devices and techniques based on whispering gallery mode resonators formed of electro-optic materials to effectuate cross modulation between whispering gallery modes of different polarizations in the resonators.

15 Claims, 4 Drawing Sheets

U.S. PATENT DOCUMENTS

| | | |
|---|---|---|
| 6,417,957 B1 | 7/2002 | Yao |
| 6,473,218 B1 | 10/2002 | Maleki et al. |
| 6,476,959 B2 | 11/2002 | Yao |
| 6,487,233 B2 | 11/2002 | Maleki et al. |
| 6,488,861 B2 | 12/2002 | Iltchenko et al. |
| 6,490,039 B2 | 12/2002 | Maleki et al. |
| 6,535,328 B2 | 3/2003 | Yao |
| 6,567,436 B1 | 5/2003 | Yao et al. |
| 6,580,532 B1 | 6/2003 | Yao et al. |
| 6,594,061 B2 | 7/2003 | Huang et al. |
| 6,762,869 B2 * | 7/2004 | Maleki et al. ............... 359/239 |
| 6,795,481 B2 | 9/2004 | Maleki et al. |
| 6,798,947 B2 | 9/2004 | Iltchenko |
| 6,853,479 B1 | 2/2005 | Ilchenko et al. |
| 6,871,025 B2 | 3/2005 | Maleki et al. |
| 6,873,631 B2 | 3/2005 | Yao et al. |
| 6,879,752 B1 | 4/2005 | Ilchenko et al. |
| 6,901,189 B1 | 5/2005 | Savchenkov et al. |
| 6,906,309 B2 | 6/2005 | Sayyah et al. |
| 6,922,497 B1 | 7/2005 | Savchenkov et al. |
| 6,928,091 B1 * | 8/2005 | Maleki et al. ................. 372/20 |
| 6,943,934 B1 | 9/2005 | Ilchenko et al. |
| 6,987,914 B2 | 1/2006 | Savchenkov et al. |
| 7,024,069 B2 | 4/2006 | Savchenkov et al. |
| 7,043,117 B2 | 5/2006 | Matsko et al. |
| 7,050,212 B2 | 5/2006 | Matsko et al. |
| 7,061,335 B2 | 6/2006 | Maleki et al. |
| 7,062,131 B2 | 6/2006 | Ilchenko |
| 7,092,591 B2 | 8/2006 | Savchenkov et al. |
| 7,133,180 B2 | 11/2006 | Ilchenko et al. |
| 7,173,749 B2 | 2/2007 | Maleki et al. |
| 7,184,451 B2 | 2/2007 | Ilchenko et al. |
| 7,187,870 B2 | 3/2007 | Ilchenko et al. |
| 7,218,662 B1 | 5/2007 | Ilchenko et al. |
| 7,248,763 B1 | 7/2007 | Kossakovski et al. |
| 7,260,279 B2 | 8/2007 | Gunn et al. |
| 7,283,707 B1 | 10/2007 | Maleki et al. |
| 7,356,214 B2 | 4/2008 | Ilchenko |
| 7,362,927 B1 | 4/2008 | Ilchenko et al. |
| 7,369,722 B2 | 5/2008 | Yilmaz et al. |
| 7,389,053 B1 | 6/2008 | Ilchenko et al. |
| 7,400,796 B1 | 7/2008 | Kossakovski et al. |
| 7,440,651 B1 | 10/2008 | Savchenkov et al. |
| 7,460,746 B2 | 12/2008 | Maleki et al. |
| 7,480,425 B2 | 1/2009 | Gunn et al. |
| 2001/0038651 A1 | 11/2001 | Maleki et al. |
| 2002/0018611 A1 | 2/2002 | Maleki et al. |
| 2002/0018617 A1 | 2/2002 | Iltchenko et al. |
| 2002/0021765 A1 | 2/2002 | Maleki et al. |
| 2002/0081055 A1 | 6/2002 | Painter et al. |
| 2002/0085266 A1 | 7/2002 | Yao |
| 2002/0097401 A1 | 7/2002 | Maleki et al. |
| 2003/0160148 A1 | 8/2003 | Yao et al. |
| 2004/0100675 A1 | 5/2004 | Matsko et al. |
| 2004/0109217 A1 | 6/2004 | Maleki et al. |
| 2004/0218880 A1 | 11/2004 | Matsko et al. |
| 2004/0240781 A1 | 12/2004 | Savchenkov et al. |
| 2005/0017816 A1 | 1/2005 | Ilchenko et al. |
| 2005/0063034 A1 | 3/2005 | Maleki et al. |
| 2005/0074200 A1 | 4/2005 | Savchenkov et al. |
| 2005/0123306 A1 | 6/2005 | Ilchenko et al. |
| 2005/0128566 A1 | 6/2005 | Savchenkov et al. |
| 2005/0175358 A1 | 8/2005 | Ilchenko et al. |
| 2005/0185681 A1 | 8/2005 | Ilchenko et al. |
| 2005/0248823 A1 | 11/2005 | Maleki et al. |
| 2006/0245456 A1 | 11/2006 | Lasri et al. |
| 2007/0009205 A1 | 1/2007 | Maleki et al. |
| 2007/0153289 A1 | 7/2007 | Yilmaz et al. |
| 2008/0001062 A1 | 1/2008 | Gunn et al. |
| 2008/0075464 A1 | 3/2008 | Maleki et al. |
| 2008/0310463 A1 | 12/2008 | Maleki et al. |
| 2009/0097516 A1 | 4/2009 | Maleki et al. |

FOREIGN PATENT DOCUMENTS

| | | |
|---|---|---|
| WO | 2005/038513 | 4/2005 |
| WO | 2005/055412 | 6/2005 |
| WO | 2005/067690 | 7/2005 |
| WO | 2005/122346 | 12/2005 |
| WO | 2006/076585 | 7/2006 |
| WO | 2007/143627 | 12/2007 |

OTHER PUBLICATIONS

Eliyahu, D., et al., "Low Phase Noise and Spurious Levels in Multi-Loop Opto-Electronic Oscillators," *Proceedings of the 2003 IEEE International Frequency Control Symposium and PDA Exhibition*, pp. 405-410, May 2003.

Eliyahu, D., et al., "Modulation Response ($S_{21}$) of the Coupled Opto-Electronic Oscillator," *Proceedings of the 2005 IEEE International Frequency Control Symposium and Exposition*, pp. 850-856, Aug. 2005.

Eliyahu, D., et al., "Tunable, Ultra-Low Phase Noise YIG Based Opto-Electronic Oscillator," *IEEE MTT-S International Microwave Symposium Digest*, 3:2185-2187, Jun. 2003.

Gorodetsky, M.L., et al., "Optical Microsphere Resonators: Optimal Coupling to High-Q Whispering-Gallery Modes," *J.Opt. Soc. Am. B*, 16(1):147-154, Jan. 1999.

Gorodetsky, M.L., et al., "Rayleigh Scattering in High-Q Microspheres," *J. Opt. Soc. Am. B*, 17(6):1051-1057, Jun. 2000.

Gorodetsky, M.L., et al., "Ultimate Q of Optical Microsphere Resonators," *Optics Letters*, 21(7):453-455, Apr. 1996.

Hryniewicz, J.V., et al., "Higher Order Filter Response in Coupled Microring Resonators," *IEEE Photonics Technology Letters*, 12(3):320-322, Mar. 2000.

Huang, S., et al., "A 'Turnkey' Optoelectronic Oscillator with Low Acceleration Sensitivity," *2000 IEEE/EIA International Frequency Control Symposium and Exhibition*, pp. 269-279, Jun. 2000.

Ilchenko, V., et al., "Electrooptically Tunable Photonic Microresonators and Photonic Bandgap Waveguide Coupling for Micro-Optoelectronic Oscillators," *GOMACTech 2003*, Tampa, Florida, pp. 1-4.

Ilchenko, V., et al., "High-Q Microsphere Cavity for Laser Stabilization and Optoelectronic Microwave Oscillator," *Proceedings SPIE Microresonators and Whispering-Gallery Modes*, vol. 3611, pp. 190-198, Jan. 1999.

Ilchenko, V., et al., "Microsphere Integration in Active and Passive Photonics Devices," *Proc. of SPIE Laser Resonators III*, vol. 3930, pp. 154-162, Jan. 2000.

Ilchenko, V., et al., "Microtorus: A High-Finesse Microcavity with Whispering-Gallery Modes," *Optics Letters*, 26(5):256-258, Mar. 2001.

Ilchenko, V., et al., "Pigtailing the High-Q Microsphere Cavity: A Simple Fiber Coupler for Optical Whispering-Gallery Modes," *Optics Letters*, 24(11):723-725, Jun. 1999.

Ilchenko, V., et al., "Tunability and Synthetic Lineshapes in High-Q Optical Whispering Gallery Modes," *Proc. of SPIE Laser Resonators and Beam Control VI*, vol. 4969, pp. 195-206, Jan. 2003.

Ilchenko, V., et al., "Whispering-Gallery-Mode Electro-Optic Modulator and Photonic Microwave Receiver," *J. Opt. Soc. Am. B*, 20(2):333-342, Feb. 2003.

Ilchenko, V., et al., "Sub-Micro Watt Photonic Microwave Receiver," *IEEE Photonics Technology Letters*, 14(11):1602-1604, Nov. 2002.

Ito, H., et al., "InP/InGaAs Uni-Travelling-Carrier Photodiode with 310 GHz Bandwidth," *Electronics Letters*, 36(21):1809-1810, Oct. 2000.

Logan, R., et al., "Stabilization of Oscillator Phase Using a Fiber-Optic Delay-Line," *IEEE 45th Annual Symposium on Frequency Control*, pp. 508-512, May 1991.

Maleki, L., "The Opto-Electronic Oscillator: Prospects for Extending the State of the Art in Reference Frequency Generation," *International Topical Meeting on Microwave Photonics*, pp. 195-198, Oct. 1998.

Matsko, A., et al., "Active Mode Locking with Whispering-Gallery Modes," *J. Opt. Soc. Am. B*, 20(11):2292-2296, Nov. 2003.

Matsko, A., et al., "Whispering-Gallery-Mode based Optoelectronic Microwave Oscillator," *Journal of Modern Optics*, 50(15-17):2523-2542, Feb. 2004.

Matsko, A., et al., "Whispering-Gallery-Mode Resonators as Frequency References. I. Fundamental Limitations," *J. Opt. Soc. Am. B*, 24(6):1324-1335, Jun. 2007.

Myers, L.E., et al., "Quasi-Phase-Matched Optical Parametric Oscillators in Bulk Periodically Poled $LiNbO_3$," *J. Opt. Soc. Am. B*, 12(11):2102-2116, Nov. 1995.

Savchenkov, A., et al., "Whispering-Gallery-Mode Resonators as Frequency References. II. Stabilization," *J. Opt. Soc. Am. B*, 24(12):2988-2997, Dec. 2007.

Vassiliev, V.V., et al., "Narrow-Line-Width Diode Laser with a High-$Q$ Microsphere Resonator," *Optics Communications*, 158(1-6):305-312, Dec. 1998.

Yao, X.S., et al., "A Novel Photonic Oscillator," *Digest of the LEOS Summer Topical Meetings*, pp. 17-18, Aug. 1995.

Yao, X.S., et al., "A Novel Photonic Oscillator," *TDA Progress Report 42-122*, pp. 32-43, Aug. 1995.

Yao, X.S., et al., "Converting Light into Spectrally Pure Microwave Oscillation," *Optics Letters*, 21(7):483-485, Apr. 1996.

Yao, X.S., et al., "Coupled Optoelectronic Oscillators for Generating Both RF Signal and Optical Pulses," *Journal of Lightwave Tecnhology*, 18(1):73-78, Jan. 2000.

Yao, X.S., et al., "Dual Microwave and Optical Oscillator," *Optics Letters*, 22(24):1867-1869, Dec. 1997.

Yao, X.S., et al., "Multiloop Optoelectronic Oscillator," *IEEE Journal of Quantum Electronics*, 36(1):79-84, Jan. 2000.

Yao, X.S., et al., "Optoelectronic Microwave Oscillator," *J. Opt. Soc. Am. B*, 13(8):1725-1735, Aug. 1996.

Yao, X.S., et al., "Optoelectronic Oscillator for Photonic Systems," *IEEE Journal of Quantum Electronics*, 32(7):1141-1149, Jul. 1996.

Yu, J., et al., "Compact Optoelectronic Oscillator with Ultra-Low Phase Noise Performance," *Electronics Letters*, 35(18):1554-1555, Sep. 1999.

International Search Report and Written Opinion dated Jun. 29, 2009 for International Application No. PCT/US2008/083469, filed Nov. 13, 2008 (7 pages).

* cited by examiner

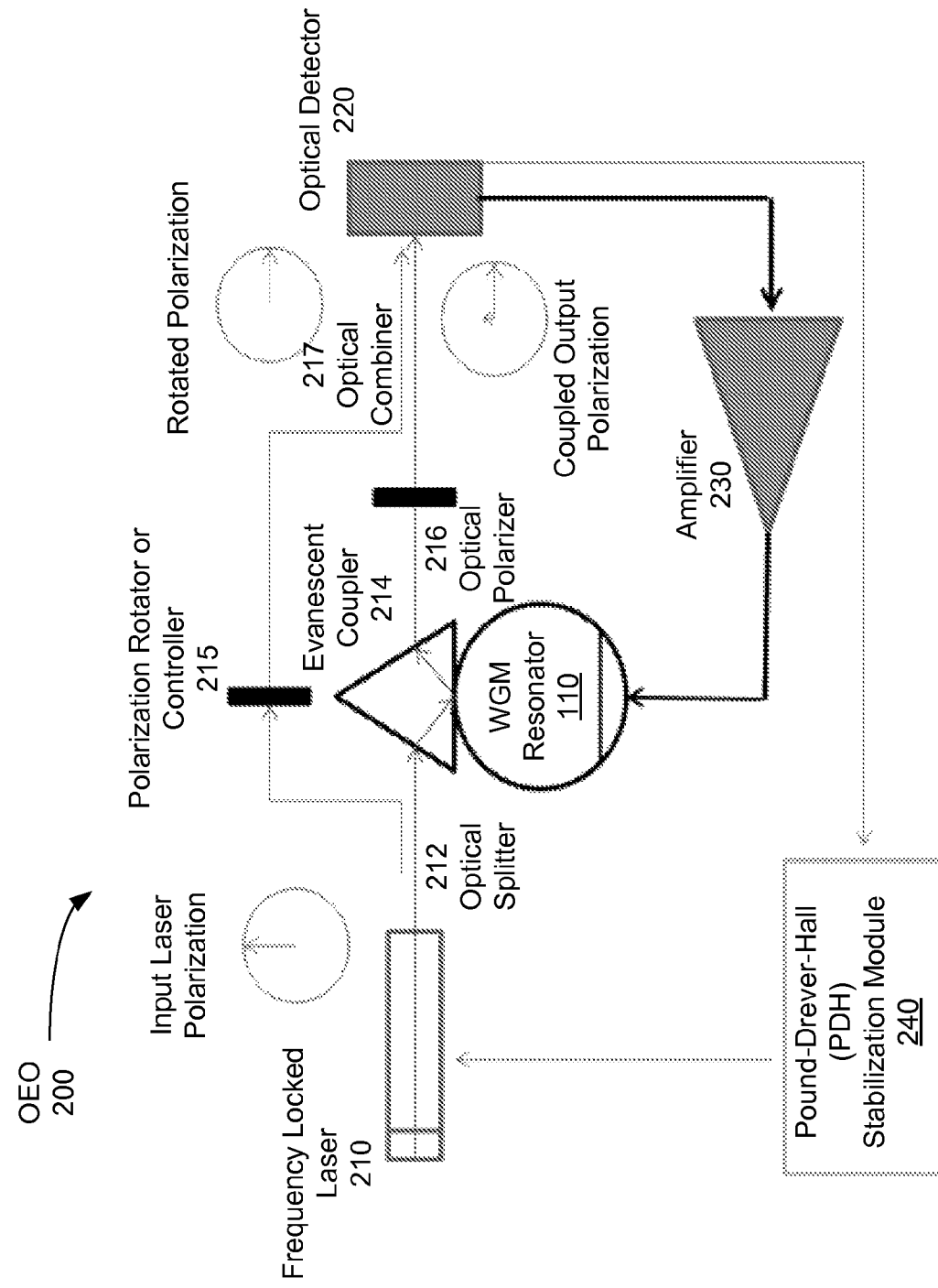

CROSS MODULATION-BASED OPTO-ELECTRONIC OSCILLATOR WITH TUNABLE ELECTRO-OPTIC OPTICAL WHISPERING GALLERY MODE RESONATOR

PRIORITY CLAIM AND RELATED APPLICATIONS

This document claims the benefits of U.S. Provisional Application No. 61/002,919 entitled "Tunable WGMR modulator and OEO with tunable modulator and polarization selector" and filed Nov. 13, 2007, the disclosure of which is incorporated by reference as part of the specification of this document.

BACKGROUND

This document relates to optical resonators and optical devices based on optical resonators.

Optical resonators may be used to spatially confine resonant optical energy in a limited cavity with a low optical loss. The resonance of an optical resonator may be used to provide various useful functions such as optical filtering, optical modulation, optical amplification, optical delay, and others. Light can be coupled into or out of optical resonators via various coupling mechanisms according to the configurations of the resonators. For example, Fabry-Perot optical resonators with two reflectors at two terminals may use partial optical transmission of at least one reflector to receive or export light.

Optical whispering gallery mode (WGM) resonators confine light in a whispering gallery mode that is totally reflected within a closed circular optical path. Unlike Fabry-Perot resonators, light in WGM resonators cannot exit the resonators by optical transmission. Light in a WGM resonator "leaks" out of the exterior surface of the closed circular optical path of a WGM resonator via the evanescence field of the WG mode. An optical coupler can be used to couple light into or out of the WGM resonator via this evanescent field.

SUMMARY

The specification of this application describes, among others, examples and implementations of photonic devices and techniques based on whispering gallery mode resonators formed of electro-optic materials to effectuate cross modulation between whispering gallery modes of different polarizations in the resonators.

In aspect, a photonic device includes a laser that is tunable and produces a laser beam at a laser frequency; an optical resonator exhibiting an electro-optic effect and structured to support whispering gallery modes circulating in the optical resonator in two mutually orthogonal polarizations and being optically coupled to the laser to receive a portion of the laser beam into the optical resonator; a laser locking mechanism to lock the laser frequency with respect to a whispering gallery mode resonance of the optical resonator; an evanescent optical coupler that evanescently couples the laser beam into the optical resonator and evanescently couples the light inside the optical resonator out of the optical resonator to produce resonator output light; electrodes formed on the optical resonator to apply a modulation control signal to effectuate an optical modulation of light based on the electro-optic effect; an optical detector to receive a portion of light from the laser that does not enter the optical resonator and at least a portion of the resonator output light; a polarization control mechanism to control polarizations of the portion of light from the laser that does not enter the optical resonator and the portion of the resonator output light to allow light in the two mutually orthogonal polarizations to interfere at the optical detector to produce a single modulation sideband corresponding to one of the two mutually orthogonal polarizations; and a feedback circuit coupled between the optical detector and the electrodes to receive a detector output from the optical detector and to produce the modulation control signal at a tunable modulation frequency.

In another aspect, a photonic device includes a laser that is tunable and produces a laser beam at a laser frequency; and an electrically controllable optical modulator to receive the laser beam and to modulate the laser beam to produce a modulated laser beam. The optical modulator includes an optical resonator exhibiting an electro-optic effect and structured to support whispering gallery modes circulating in the optical resonator in two mutually orthogonal polarizations and being optically coupled to the laser to receive a portion of the laser beam into the optical resonator, and electrodes formed on the optical resonator to apply a modulation control signal to effectuate an optical modulation of light based on the electro-optic effect. This photonic device also includes an active opto-electronic feedback loop that comprises an optical part coupled to the optical resonator to receive the modulated laser beam and an electrical part that produces the modulation control signal, and an optical detector coupled between the optical part and the electrical part and the opto-electronic feedback loop feeds the modulation control signal in phase to the electrodes on the optical resonator to generate and sustain both optical modulation and electrical oscillation at the modulation frequency of the modulator. A polarization control mechanism is provided in this photonic device to control polarization of light received at the optical detector to allow light in the two mutually orthogonal polarizations to interfere at the optical detector to produce a single modulation sideband so that a modulation frequency of the modulator at a difference between frequencies of whispering gallery modes at the two mutually orthogonal polarizations inside the optical resonator.

In yet another aspect, a method is provided for operating an electro-opto oscillator having an electrically controllable optical modulator comprising an optical resonator exhibiting an electro-optic effect and structured to support whispering gallery modes circulating in the optical resonator in two mutually orthogonal polarizations. This method includes providing an active opto-electronic feedback loop that comprises an optical part coupled to the optical resonator to receive a modulated laser beam from the optical modulator and an electrical part that produces the modulation control signal, and an optical detector coupled between the optical part and the electrical part; operating the opto-electronic feedback loop to feed the modulation control signal in phase to electrodes on the optical resonator to generate and sustain both optical modulation and electrical oscillation at a modulation frequency of the modulator; and controlling polarization of light received at the optical detector to obtain a single modulation sideband in the output of the optical detector to set the modulation frequency of the modulator at a difference between frequencies of whispering gallery modes at the two mutually orthogonal polarizations inside the optical resonator.

These and other aspects, associated examples and implementations are described in detail in the drawings, the detailed description, and the claims.

BRIEF DESCRIPTION OF THE DRAWINGS

FIG. 2 shows an example of a cross-mode tunable WGM resonator modulator OEO using the electro-optic WGM resonator modulator in FIGS. 1A and 1B.

DETAILED DESCRIPTION

An opto-electronic oscillator (OEO) is an oscillator with a positive feedback loop that has both electronic and optical components. See, e.g., U.S. Pat. Nos. 5,723,856 to Yao and Maleki and 5,777,778 to Yao, which are incorporated by reference as part of the specification of this document. Such an OEO includes an electrically controllable optical modulator and at least one active opto-electronic feedback loop that comprises an optical part and an electrical part interconnected by a photodetector. The opto-electronic feedback loop receives the modulated optical output from the modulator and converted it into an electrical signal to control the modulator. The loop produces a desired delay and feeds the electrical signal in phase to the modulator to generate and sustain both optical modulation and electrical oscillation at the modulation frequency of the modulator when the total loop gain of the active opto-electronic loop and any other additional feedback loops exceeds the total loss.

Therefore, OEOs use optical modulation to produce oscillations in frequency spectral ranges that are outside the optical spectrum, such as in RF and microwave frequencies. The generated oscillating signals are tunable in frequencies and can have narrow spectral linewidths and low phase noise in comparison with the signals produced by other RF and microwaves oscillators. Notably, the OEOs are optical and electronic hybrid devices and thus can be used in various applications.

The OEOs described in this document use a whispering mode gallery mode resonator made of an electro-optic material as the optical modulator for modulating the CW laser light from a laser, to filter the modulated laser light and to provide the optical delay due to the high Q factor for the feedback loop. The electro-optic material supports two mutually orthogonal polarizations which may be referred to as the original wave and the extra-ordinary wave, or the TM mode and the TE mode. These two different polarized waves undergo a frequency shift with respect to each other in the electro-optic WGM resonator modulator and proper control of the polarization in OEO feedback loop can be used to produce one modulation sideband in the detector output of the optical detector that interconnects the electrical portion and the optical portion of the feedback loop. Therefore, a single sideband (SSB) modulation can be achieved in the OEO and provides a flexible operating frequency range that is not available in OEOs that operate at their free spectral range (FSR).

Figure 1A:
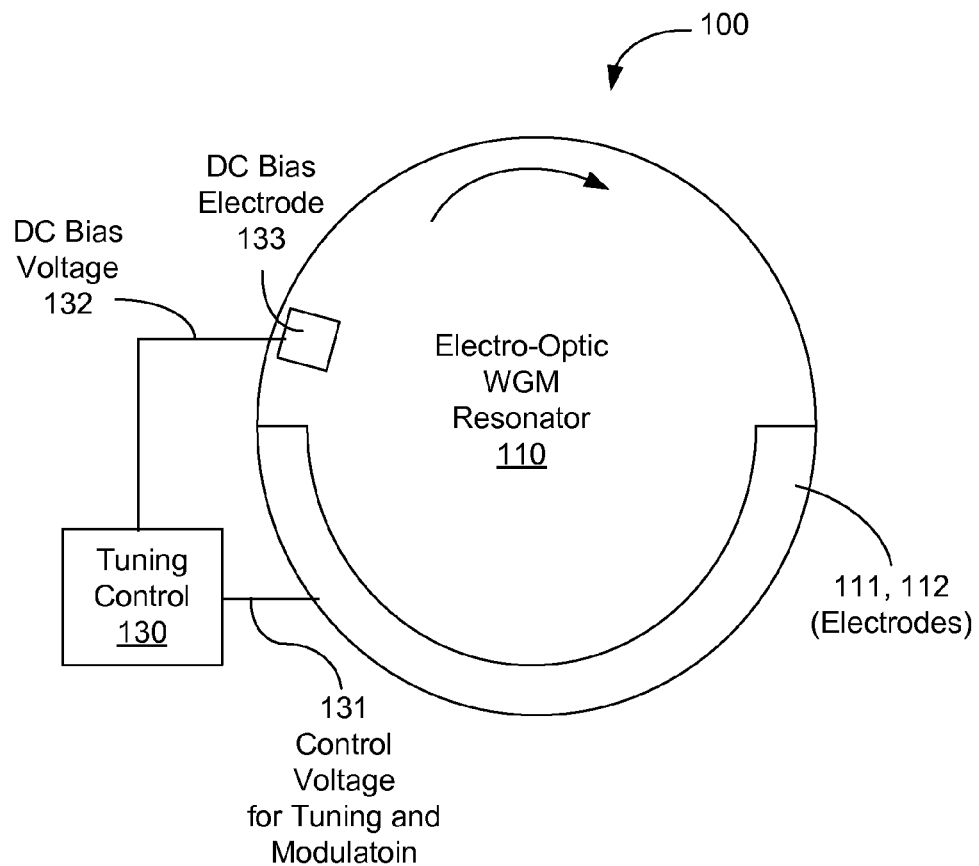
FIGS. 1A and 1B show an example of an electro-optic WGM resonator modulator for an OEO.
Figure 1B:
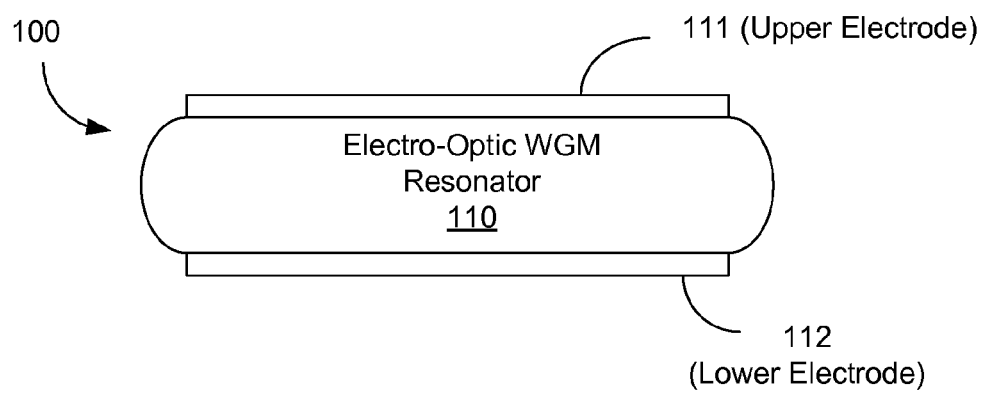

FIGS. 1A and 1B show an example of an electro-optic WGM resonator modulator 100 having a WGM resonator 110. The electro-optic material for the entire or part of the resonator 610 may be an electro-optic crystal such as Lithium Niobate ("Lithium Niobate resonator") or a semiconductor multiple quantum well structure. One or more electrodes 111 and 112 may be formed on the resonator 110 to apply a control electrical field in at least the region where the WG modes are present to control the index of the electro-optical material and to change the filter function of the resonator. Assuming the resonator 110 has disk or ring geometry, the electrode 111 may be formed on the top of the resonator 110 and the electrode 112 may be formed on the bottom of the resonator 110 as illustrated in the side view of the device in FIG. 1B. In one implementation, the electrodes 111 and 112 may constitute an RF or microwave resonator to apply the RF or microwave signal to co-propagate along with the desired optical WG mode. For example, the electrodes 111 and 112 may be microstrip line electrodes. The electrodes 111 and 112 may also form an electrical waveguide to direct the electrical control signal to propagate along the paths of the WG modes. A tuning control unit 130 such as a control circuit may be used to supply the electrical control signal 131 to the electrodes 111 and 112.

In operating the resonator modulator 100, the control unit 130 may supply a voltage as the electrical control signal to the electrodes 111 and 112 as the modulation control signal. A DC bias electrode 133 can be provided to supply a DC voltage 132 to set the resonance peak of the resonator 100 at a desired spectral location. The DC voltage may be adjusted by the control unit 630 to tune the spectral position of the transmission peak when such tuning is needed.

For example, a Z-cut LiNbO$_3$ disk cavity with a diameter of d=4.8 mm and a thickness of 170 µm may be used as the resonator 610. The cavity perimeter edge may be prepared in the toroidal shape with a 100 µm radius of curvature. As an alternative to the strip electrodes shown in FIG. 1A, the top and bottom surfaces of the disk resonator may be coated with conductive layers for receiving the external electrical control signal. A metal such as indium may be used to form the conductive coatings. The signal modulation is achieved by applying and adjusting a modulation control voltage to the top and bottom conductive coatings. Each conductive coating may be absent on the central part of the resonator and are present at the perimeter edge of the resonator where WGMs are localized.

Figure 3:
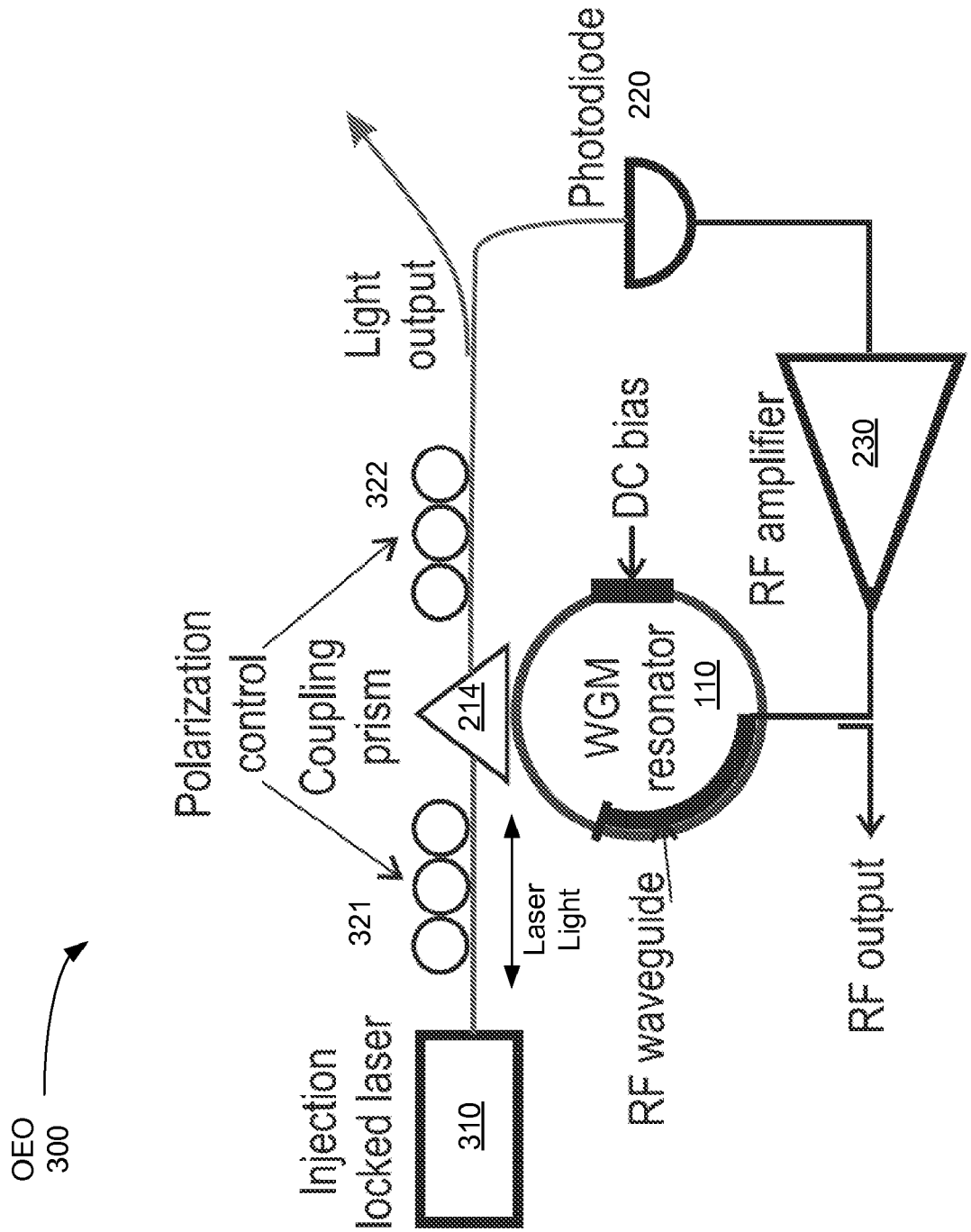
FIG. 3 shows another example of a cross-mode tunable WGM resonator modulator OEO using the electro-optic WGM resonator modulator in FIGS. 1A and 1B.

WGM narrowband modulators operate at a particular frequency determined by the FSR of the WGM resonator. The following OEO examples provide a SSB modulation with a compressed carrier (i.e. frequency shifter) to provide a tunable OEO operation. FIGS. 2 and 3 show such OEO examples.

The cross-modulation between modes of different polarizations in the WGM resonator is used to achieve the SSB modulation. In optically transparent ferroelectrics like lithium niobate and lithium tantalate electro-optical indexes of ordinary and extraordinary polarization differ significantly. This allows simple and very efficient differential detuning of one mode from another with just regular DC bias. Mixed with additional microwave field of frequency equal to difference of resonant optical frequencies the modes would interact if properly phase matched in collinear configuration. Phase matching does not happen automatically since refractive indexes of ordinary, extraordinary optical modes (i.e., mode 1 and mode 2) and the microwave mode are different. We propose to exploit specifically undulated electrode which modulates electric field along the rim of the WGM resonator.

The frequency of the required spatial modulation is determined from phase matching conditions:

$$\frac{\omega_2}{c}n_2 - \frac{\omega_1}{c}n_1 \pm \frac{\omega_2 - \omega_1}{c}N_{eff} = \frac{2\pi}{\Delta}$$

To estimate this value, we consider ω2−ω1 over two π is close to FSR of the resonator, $$A = \frac{D}{2\Delta},$$

and ω1 corresponds to optical frequency.

$$A = \frac{2\pi}{l\frac{n_2 - n_1}{n} + \left(1 \pm \frac{N_{eff}}{n}\right)}$$

For lithium tantalite, the complete phase matching occurs when disks diameter is about 116 μm, and about 8 μm for lithium niobate.

An optical grating written on electrode of the modulator designed for phase matching in tantalate resonators of 400-μm diameter has a period of 138 degrees. For niobate this value is about 6 degrees. Both gratings can be easily doable with lithography. The former may be manufacturable even by hands since spatial period is 0.48 mm only. The last means that sub-millimeter tantalate modulator with regular horseshoe or ring electrode does have ability of cross-polarized ordinary to extraordinary (o-e) modulation.

This kind of modulation accepts one polarization of light, and rotates its polarization while microwave modulation.

The electro-optical WGM resonator modulator operates at differential frequencies between optical modes in mutually orthogonal polarizations. In some nonlinear crystals, this difference in frequency can be tuned with the control voltage and the operating temperature. For instance, lithium niobate shows three times different electro-optical index of both polarizations. It was previously demonstrated that fast frequency shift of the resonator made of lithium niobate is as high as 20 GHz per 100V for one and 7 GHz for another. Thus tunability span of OEO based on lithium niobate cross-mode modulator is 13 GHz. Hence, the operational frequency of 35 GHz high-efficient receiver can be changed very quickly by voltage through ~30%. On the other hand thermal operational point can change this differential frequency even further to terahertz range. The SSB modulation used in the present designs eliminates the mode for the second sideband. lithium tantalate-based modulators tend to have better efficiency of modulation than lithium niobate based modulators since mode overlapping in the Lithium tantalate is much better as a result of very similar refractive indexes of both polarizations.

Therefore, the present modulator designs combine advantages of narrowband high-Q-factor WGMR-based modulator with tunability and can be tuned within the differential detuning range, from X band to W band. The WGMR modulator of high efficiency can be a tunable cross-mode modulator to tune OEO frequency.

FIG. 2 shows the first example 200 of an OEO based on the cross modulation between two polarization modes in the WGM resonator. This OEO 200 includes a tunable laser 210 that produces a CW laser beam for the OEO 200, an WGM resonator modulator based on the design in FIGS. 1A and 1B with an electro-optic WGM resonator 110, an evanescent coupler 214 for coupling light into the WGM resonator 110 for optical modulation, delay and filtering and coupling modulated light out of the WGM resonator 110, and an optical detector 220 for interfacing the optical and electrical portions of the OEO feedback loop. An optional amplifier 230 may be coupled in the electrical portion of the OEO loop to amplify the output signal from the detector 220.

The laser 210 is linearly polarized and is split into two laser beams along two optical paths by an optical splitter 212 located between the laser 210 and the evanescent coupler 214. The first optical path includes a polarization rotator or a polarization controller 215 which rotates the optical polarization of the first laser beam that is not modulated by 90 degrees. The second optical path leads to the evanescent coupler 214 and the WGM resonator modulator, and an optical polarizer 214 that transmits light in a polarization orthogonal to the input laser polarization and rejects light in the input laser polarization. An optical combiner 217 is provided to combine light in the first and second optical paths to produce a combined output beam to the optical detector 220. The beat between the two beams at the combiner 216 is detected by the detector 220 and is converted to a single sideband (SSB) signal.

The opto-electronic loop of the OEO 200 in FIG. 2 has an optical portion formed by the WGM resonator 110 as an optical delay element, an optical filter and an optical modulator, and an electrical portion which includes the optical detector 220 (e.g., a photodiode), and the electrical feedback path to the electrodes on the resonator 110 (including the amplifier 230). This is a closed loop and can be operated to have a loop gain higher than the loop loss and the feedback to the resonator 110 can be in phase. Under such conditions, the closed loop is a positive feedback loop and will oscillate as an opto-electronic oscillator (OEO) at a frequency at which the light in the resonator 110 is modulated.

The tunable laser 210 is locked in frequency to the mode of the modulator 110 in one of the two orthogonal polarizations, e.g., the extraordinary polarization. This laser locking can be achieved by various techniques. In one example, which is shown in FIG. 2, a Pound-Drever-Hall (PDH) stabilization module 240 is used to lock the laser 210. Various PDH stabilization implementations are known. In another example, an injection locking based on an optical feedback from the resonator 110 is used without the PDM stabilization module 240. The laser 210 (e.g., a diode laser) can be optically coupled to the WGM resonator 110 via the evanescent coupler 214 that couples light out of the resonator 110 back to the laser 210. This feedback light of the resonator 110 is injected back to the laser 210 to stabilize the laser 210 so that the laser wavelength is locked at the wavelength of the WGM mode in the resonator 110 and to reduce the linewidth of the laser 210. One way to achieve this injection locking is described in U.S. patent application Ser. No. 12/139,449 entitled "TUNABLE LASERS LOCKED TO WHISPERING GALLERY MODE RESONATORS" and filed on Jun. 13, 2008, which is incorporated by reference as part of the specification of this application.

The WGM resonator 110 supports two WGM polarization modes: the ordinary wave and the extra-ordinary wave. The evanescent coupler 214 (e.g., a prism coupler) can optically couple light in both modes. The optical polarizer 216 can be oriented to select one of the modulated light in the two modes for the optical detection and conversion at the optical detector 220. As an example, the optical polarizer 216 can be used to suppress the ordinary emission in the output allowing only the signal of the extra-ordinary wave to be directed to the optical detector. Output of extraordinary polarization is mixed coherently by aligning polarization in the other optical path with small portion of initial laser's power to produce AM microwave signal at detector 220. The detector output is fed back to the modulator 110. In this scheme oscillations of a fixed frequency at FSR of extraordinary polarization are suppressed because of polarized output and the OEO oscillator operates at the tunable differential ordinary-extraordinary frequency.

Various polarization selective elements for output coupling may be implemented for the OEO 200 in FIG. 2. For example, a prism-based output coupler with a polarizer can be used as shown in FIG. 2. In another example, a probe prism of a high refractive index (e.g., a Ge prism) can be used and, due to boundary conditions, this prism couples out extraordinary polarization more efficiently than ordinary one. As a result in OEO pumped with ordinary polarization oscillations at fixed FSR can be suppressed. In yet another example, an optical detector can be attached to the rim of the resonator 110 through a transparent spacer. The ordinary polarization has an index (n2) higher than that of the evanescent field which allows simple and compact suppression of the fixed frequency oscillation.

Hence, based on the above example, it is possible to achieve multiple functions in a tunable OEO: optical modulation of light, optical filtering, optical delay and optical tuning of the frequency, with a single WGM resonator made with an electro-optic crystal. WGM resonators are axio-symmetric dielectric structures that support modes with very high quality factors (e.g., $2\times10^9$). Such WGM resonators can be configured so that sidebands on the optical carrier at the RF frequency are generated at the output when an optical mode is excited with the pump laser light and a RF signal with a frequency corresponding to the free spectral range (FSR) of the resonator are simultaneously applied. This scheme is used to realize an efficient EOM. Such a modulator can improve the OEO properties. An efficient OEO calls for the intrinsically amplitude modulation. The WGM-based electro-optic modulation (EOM) scheme by constructing a structure that produces single sideband modulation (SSB). Such a modulation always has an amplitude counterpart. This can be accomplished by applying the RF field along the radius of a WGM resonator produced from a Zcut lithium niobate preform. Such an RF field couples optical TE and TM mode families of the WGM resonator due to the non-diagonal element $r_{51}$ of the electro-optic tensor of the material. Because the TE and TM mode families are frequency shifted with respect to each other, only one modulation sideband is generated. By applying a DC voltage to the WGM resonator the modes belonging to different mode families move in frequency, but at different rates. Thus, the mode spacing, and the corresponding modulation frequency given by the mode spacing, can be tuned. This configuration leads to a highly efficient, tunable, narrow-band modulator, the three parameters that allow realization of a high performance, tunable OEO.

FIG. 3 shows another OEO example 300 based on the above cross modulation of two polarization modes in the WGM resonator 110. The semiconductor laser 210 is injection locked to the lithium niobate or tantalate resonator 110 arranged as a SSB modulator. The output of the modulator 110 may be sent to a semiconductor optical amplifier (SOA) before entering a long length of fiber that is directs light to the optical detector 220. The optical detector 220 produces an electric signal that is amplified before being fed back to the modulator 110 to complete the OEO loop. The narrow band-width of the resonator 110 provides the filter function for the loop, and the change in the mode spacing produced by the applied DC voltage bias tunes the frequency. Such an oscillator may be tuned from 20 to 35 GHz. The spectral purity goal corresponds to the phase noise of −120 dBc at 100 kHz.

Different from the two optical path design in the OEO 200 shown in FIG. 2, the OEO 300 in FIG. 3 implements two polarization controllers 321 and 322 to achieve the cross modulation of the two polarization modes in the resonator 110. The first polarization controller 321 is placed in the optical path (e.g., the fiber) between the laser 310 and the evanescent coupler 214 to place the polarization of the laser light at 45 degrees with respect to either one of the two orthogonal polarizations in the resonator 110. Under this input polarization configuration, one half of the input laser light is coupled into the WGM resonator and the remaining one half is reflected, without entering into the resonator 110, to pass through the evanescent prism coupler 214 into the output optical path to the optical detector 220. The one half of the laser light coupled into the resonator 110 is modulated and filtered and is then coupled out by the coupler 214 to overlap with the reflected laser input light. The combined light is then directed into the detector 220.

The WGM resonator 110 can be made of an electro-optic material with proper non-diagonal electro-optic coefficients (e.g. lithium niobator lithium tantalate). The optical WGMs overlap with the field of an RF resonator or waveguide which can be built on the surface of the WGM resonator. Two optical WGMs characterized with electric field operators E1 and E2 are coupled with the RF field EM in the case of nonzero integral proportional to the interaction energy $$\varepsilon = \frac{1}{8\pi} \int_V \sum_{i,j,k} r_{ijk} D_i D_j E_{Mk}\, dv,$$

where $r_{ijk}$ describes the space dependent electro-optic nonlinearity of the resonator host material, $D_i = \Sigma_j \epsilon_{ij} E_j$, electric field El is presented as a sum of two counter-propagating waves, and V is the volume of the WGM resonator.

The possibility of interaction between two WGM mode families having different polarizations is important for our application because the mode families can be tuned one with respect to the other using the same bias voltage applied to the resonator. Moreover, because the mode families are shifted one with respect to the other it is possible to realize single sideband modulation in the system. On the other hand, the interaction between the light and RF signal is not always possible. For instance, if the RF field is homogeneous and is applied along, say, Z-axis of lithium niobate WGM resonator, the coupling between the optical modes having TM with its electric field parallel to Z and TE with its electric field perpendicular to Z is forbidden. However, it is possible to realize resonators where neither pure TE not TM mode families exist. The interaction is allowed among those modes if the spatial overlap integral between the modes is not equal to zero.

Another possibility is related to the usage of non-diagonal elements of the linear electro-optic tensor of the material. For example, lithium niobate has nonzero electro-optic coefficients r42=r51. Those coefficients introduce coupling between TE and TM WGMs in a resonator fabricated from a z-cut LiNbO3 preform if the RF field has a radial component.

The space averaged interaction energy for the optical and RF fields is given by $$\varepsilon = \frac{n_e^2 n_o^2}{4\pi} \int_V r_{51} (\vec{E}_{TM} \cdot \vec{E}_{RF}) E_{TE}^* dv,$$

where we take into account that $E_{TE} = \hat{z} E_{TE}$. The averaged interaction energy is generally zero because ne≠no. However, either periodical poling of the material or creating a special electrode shape for the RF mode phase matches the interaction such that ϵ≠0. In addition, a resonator can be fabricated from, say, x-cut and z-cut segments that results in the interaction between RF and different mode families.

Figure 4:
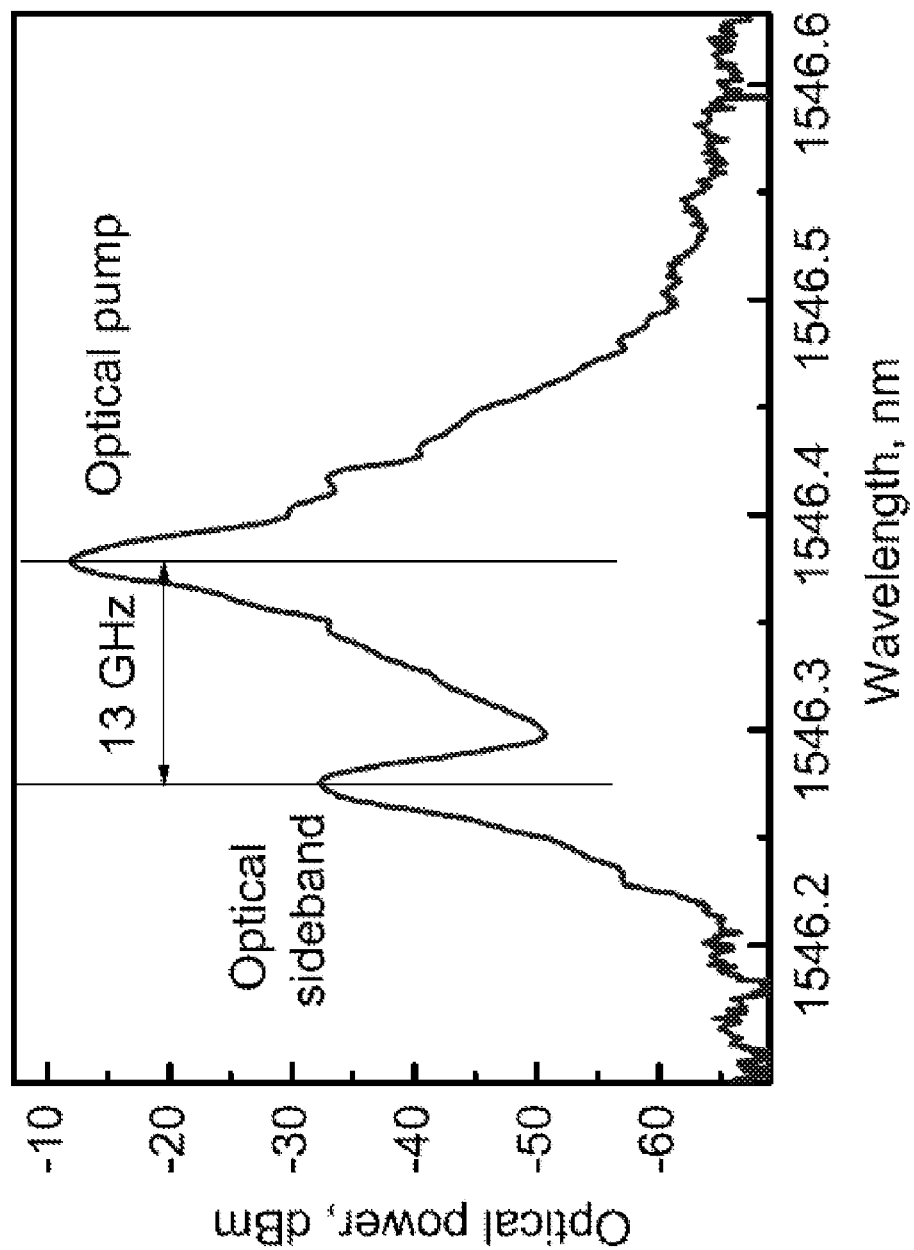
FIG. 4 shows measurements of the interaction of TE and TM mode families in a single sideband modulation in a WGM resonator modulator having a 35-GHz free spectral range.

FIG. 4 shows measurements of the interaction of TE and TM mode families in a single sideband modulation in a WGM resonator modulator having a 35-GHz free spectral range. Such a modulator generates only one sideband. The feature of this system is that the resonator modulation is achieved between the modes separated not by the free spectral range of the resonator, but rather by some value given by the resonator shape, the operating temperature, and the bias voltage applied to the resonator.

While this specification contains many specifics, these should not be construed as limitations on the scope of an invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

Only a few implementations are disclosed. However, it is understood that variations, enhancements and other implementations can be made based on what is described and illustrated in this patent application.

What is claimed is:

1. A photonic device, comprising:
    a laser that is tunable and produces a laser beam at a laser frequency;
    an optical resonator exhibiting an electro-optic effect and structured to support whispering gallery modes circulating in the optical resonator in two mutually orthogonal polarizations and being optically coupled to the laser to receive a portion of the laser beam into the optical resonator;
    a laser locking mechanism to lock the laser frequency with respect to a whispering gallery mode resonance of the optical resonator;
    an evanescent optical coupler that evanescently couples the laser beam into the optical resonator and evanescently couples the light inside the optical resonator out of the optical resonator to produce resonator output light;
    electrodes formed on the optical resonator to apply a modulation control signal to effectuate an optical modulation of light based on the electro-optic effect;
    an optical detector to receive a portion of light from the laser that does not enter the optical resonator and at least a portion of the resonator output light;
    a polarization control mechanism to control polarizations of the portion of light from the laser that does not enter the optical resonator and the portion of the resonator output light to allow light in the two mutually orthogonal polarizations to interfere at the optical detector to produce a single modulation sideband corresponding to one of the two mutually orthogonal polarizations; and
    a feedback circuit coupled between the optical detector and the electrodes to receive a detector output from the optical detector and to produce the modulation control signal at a tunable modulation frequency.

2. The device as in claim 1, wherein:
the laser locking mechanism comprises a Pound-Drever-Hall (PDH) stabilization module that locks the laser.

3. The device as in claim 1, wherein:
the laser locking mechanism is a injection locking mechanism that feeds light inside the optical resonator back into the laser to lock the laser.

4. The device as in claim 1, wherein:
the polarization control mechanism comprises:
    an optical splitter located in an optical path between the laser and the evanescent optical coupler and the laser to split the laser beam from the laser into a first portion along a first optical path directing the first portion away from the evanescent coupler and a second portion along a second optical path leading to the evanescent optical coupler;
    a first optical polarization device in the first optical path to rotate polarization of the first portion by 90 degrees;
    a second optical polarization device in an optical path of the resonator output light from the evanescent optical coupler to transmit light in a polarization that is parallel to the polarization of light output by the first optical polarization device; and
    an optical combiner that combines the light from the first optical polarization device and the second optical polarization device to produce combined light that enters the optical detector.

5. The device as in claim 1, wherein:
the polarization control mechanism comprises:
    a first optical polarization controller located in an optical path between the laser and the evanescent optical coupler to set polarization of the laser light entering the optical resonator at 45 degrees with respect either one of the two mutually orthogonal polarizations supported by the optical resonator; and
    a second optical polarization controller located in an optical path between the optical detector and the evanescent optical coupler.

6. The device as in claim 1, wherein:
the optical resonator is made of lithium niobate.

7. The device as in claim 1, wherein:
the optical resonator is made of lithium tantalite.

8. The device as in claim 1, wherein:
the electrodes formed on the optical resonator comprise electrodes that receive the modulation control signal for optical modulation and a DC bias electrode to apply a DC bias voltage to tune the optical resonator.

9. The device as in claim 1, wherein:
the laser is a semiconductor laser.

10. A photonic device, comprising:
a laser that is tunable and produces a laser beam at a laser frequency;

an electrically controllable optical modulator to receive the laser beam and to modulate the laser beam to produce a modulated laser beam, the optical modulator comprising an optical resonator exhibiting an electro-optic effect and structured to support whispering gallery modes circulating in the optical resonator in two mutually orthogonal polarizations and being optically coupled to the laser to receive a portion of the laser beam into the optical resonator, and electrodes formed on the optical resonator to apply a modulation control signal to effectuate an optical modulation of light based on the electro-optic effect;

an active opto-electronic feedback loop that comprises an optical part coupled to the optical resonator to receive the modulated laser beam and an electrical part that produces the modulation control signal, and an optical detector coupled between the optical part and the electrical part, the opto-electronic feedback loop feeding the modulation control signal in phase to the electrodes on the optical resonator to generate and sustain both optical modulation and electrical oscillation at the modulation frequency of the modulator; and a polarization control mechanism to control polarization of light received at the optical detector to allow light in the two mutually orthogonal polarizations to interfere at the optical detector to produce a single modulation sideband so that a modulation frequency of the modulator at a difference between frequencies of whispering gallery modes at the two mutually orthogonal polarizations inside the optical resonator.

11. The device as in claim 10, wherein:
the optical resonator is made of lithium niobate.

12. The device as in claim 10, wherein:
the optical resonator is made of lithium tantalite.

13. The device as in claim 10, wherein:
the electrodes formed on the optical resonator comprise electrodes that receive the modulation control signal for optical modulation and a DC bias electrode to apply a DC bias voltage to tune the optical resonator.

14. The device as in claim 10, wherein:
the laser is locked to a whispering gallery mode resonance of the optical resonator.

15. A method for operating an electro-opto oscillator having an electrically controllable optical modulator comprising an optical resonator exhibiting an electro-optic effect and structured to support whispering gallery modes circulating in the optical resonator in two mutually orthogonal polarizations, comprising:

providing an active opto-electronic feedback loop that comprises an optical part coupled to the optical resonator to receive a modulated laser beam from the optical modulator and an electrical part that produces the modulation control signal, and an optical detector coupled between the optical part and the electrical part;

operating the opto-electronic feedback loop to feed the modulation control signal in phase to electrodes on the optical resonator to generate and sustain both optical modulation and electrical oscillation at a modulation frequency of the modulator; and controlling polarization of light received at the optical detector to obtain a single modulation sideband in the output of the optical detector to set the modulation frequency of the modulator at a difference between frequencies of whispering gallery modes at the two mutually orthogonal polarizations inside the optical resonator.

* * * * *

UNITED STATES PATENT AND TRADEMARK OFFICE
CERTIFICATE OF CORRECTION

| | | |
|---|---|---|
| PATENT NO. | : 7,801,189 B2 | Page 1 of 1 |
| APPLICATION NO. | : 12/270839 | |
| DATED | : September 21, 2010 | |
| INVENTOR(S) | : Maleki et al. | |

It is certified that error appears in the above-identified patent and that said Letters Patent is hereby corrected as shown below:

Title Page
    On Page 2, in Field (56), under "OTHER PUBLICATIONS", in Column 2, Line 3, please delete "Sympsoium" and insert -- Symposium --, therefor.

On Page 3, in Field (56), under "OTHER PUBLICATIONS", in Column 2, Lines 4-5, please delete "Tecnhology," and insert -- Technology, --, therefor.

In Column 7, Line 45, please delete "Zcut" and insert -- Z-cut --, therefor.

In Column 8, Line 43, please delete "E1" and insert -- $E_1$ --, therefor.

In Column 8, Line 65, please delete "r42=r51." and insert -- $r_{42}=r_{51}.$ --, therefor.

In Column 9, Line 9, please delete " $\vec{E}_{TE}$ " and insert -- $\vec{E}_{TE}$ --, therefor.

Signed and Sealed this
Twelfth Day of July, 2011

David J. Kappos
*Director of the United States Patent and Trademark Office*